United States Patent [19]
Koshiishi et al.

[11] Patent Number: 5,089,747
[45] Date of Patent: Feb. 18, 1992

[54] ELECTRON BEAM EXCITATION ION SOURCE

[75] Inventors: Akira Koshiishi, Kofu; Kohei Kawamura, Nirasaki; Naoki Takayama, Kofu, all of Japan

[73] Assignee: Tokyo Electron Limited, Tokyo, Japan

[21] Appl. No.: 480,765

[22] Filed: Feb. 16, 1990

[30] Foreign Application Priority Data

Feb. 16, 1989 [JP] Japan .................................. 1-39016
Feb. 16, 1989 [JP] Japan .................................. 1-39017

[51] Int. Cl.$^5$ ............................................. H01J 27/02
[52] U.S. Cl. ........................... 315/111.81; 315/111.21; 315/111.31; 313/231.31; 250/423 R
[58] Field of Search ............. 315/111.21, 111.31, 315/111.41, 111.81; 313/231.31; 250/423 R, 427, 492.3

[56] References Cited

U.S. PATENT DOCUMENTS

| | | | |
|---|---|---|---|
| 3,178,604 | 4/1965 | Eklund | 313/147 |
| 3,448,315 | 6/1969 | Hirsch et al. | 313/63 |
| 3,924,134 | 12/1975 | Uman et al. | 250/423 |
| 4,691,109 | 9/1987 | Magee et al. | 250/426 |
| 4,841,197 | 6/1989 | Takayama et al. | 315/111.41 X |

FOREIGN PATENT DOCUMENTS

| | | |
|---|---|---|
| 0003842 | 9/1979 | European Pat. Off. |
| 0154824 | 9/1985 | European Pat. Off. |
| 61-121967 | 6/1986 | Japan |
| 61-290629 | 12/1986 | Japan |
| 1457960 | 12/1976 | United Kingdom |
| 2053559 | 2/1981 | United Kingdom |
| 2146836 | 4/1985 | United Kingdom |

*Primary Examiner*—Eugene R. LaRoche
*Assistant Examiner*—Do Hyun Yoo
*Attorney, Agent, or Firm*—Oblon, Spivak, McClelland, Maier & Neustadt

[57] ABSTRACT

An electron beam excitation ion source includes a housing having an ion generation chamber therein, a port for supplying a discharge gas to the ion generation chamber, a porous electrode for supplying accelerated electrons to the ion generation chamber from an electron generation chamber, causing the accelerated electrons to collide against the discharge gas to generate a plasma containing ions in the ion generation chamber. The housing have an ion extraction slit port through which the ions are extracted from the ion generation chamber outside the housing. An electrode is formed around the ion extraction port, for causing a local discharge around the ion extraction port so as to guide the ions in the plasma to the ion extraction port.

9 Claims, 4 Drawing Sheets

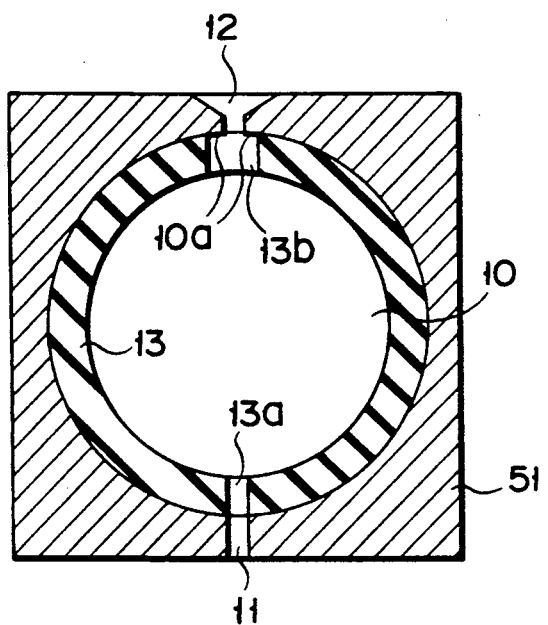
F I G. 2
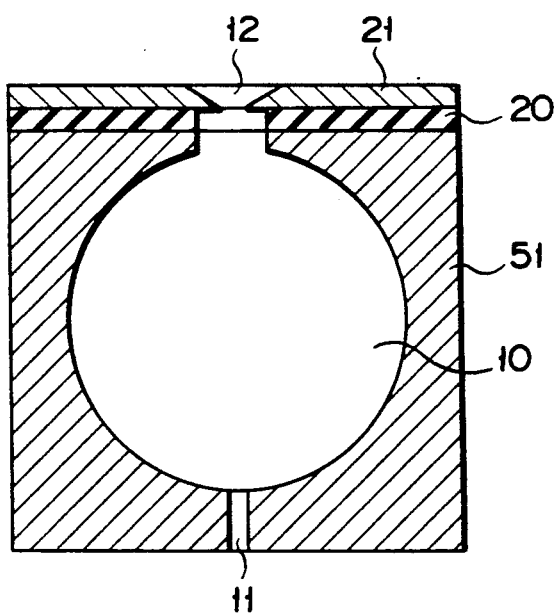
F I G. 3

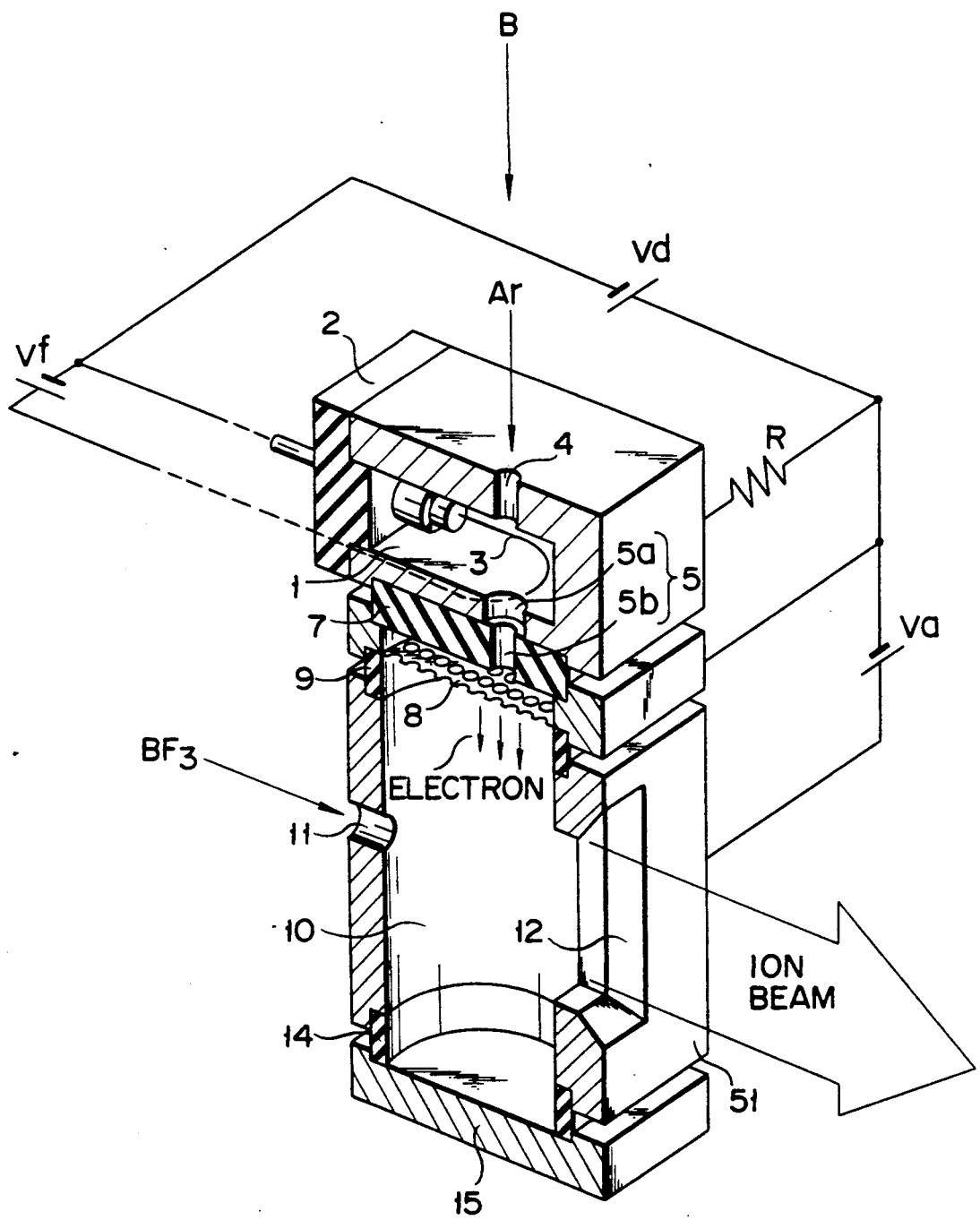
F I G. 4

5,089,747

ELECTRON BEAM EXCITATION ION SOURCE

BACKGROUND OF THE INVENTION

1. Field of the Invention

The present invention relates to an electron beam excitation ion source.

2. Description of the Related Art

Strong demand has arisen for developing an ion source having a large current and a long service life in, e.g., an ion-implantation apparatus utilized for manufacturing semiconductor devices.

The present applicant proposed ion beam excitation ion sources each for ionizing a source gas with an electron beam in Published Unexamined Japanese Patent Application No. 61-290629 and Japanese Patent Application No. 61-121967.

In such an electron beam excitation ion source, electrons are extracted from a plasma formed by a glow discharge and are accelerated. The accelerated electrons are guided to an ion generation chamber having a source gas atmosphere for generating a predetermined type of ions. The electrons are bombarded against source gas molecules to generate a plasma. Ions are then extracted from the plasma through an ion extraction slit formed in the ion generation chamber. This ion source has an advantage in that a high ion current density can be obtained by low ion energy.

Further demand has arisen for increasing an ion current density to shorten a processing time and increase a throughput even in the electron beam excitation ion source described above.

SUMMARY OF THE INVENTION

It is an object of the present invention to provide an electron beam excitation ion source capable of extracting ions relatively efficiently and obtaining a high ion current density to shorten a processing time and increase a throughput.

In an aspect of the present invention, there is provided an electron beam excitation ion source comprising:

a housing having an ion generation chamber therein;

means for supplying a discharge gas to the ion generation chamber;

means for supplying accelerated electrons to the ion generation chamber, causing the accelerated electrons to collide against the discharge gas to generate a plasma containing ions in the ion generation chamber, the housing having an ion extraction port through which the ions are extracted from the ion generation chamber outside the housing; and an electrode, formed around the ion extraction port, for causing a local discharge around the ion extraction port so as to guide the ions in the plasma to the ion extraction port.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate presently preferred embodiments of the invention, and together with the general description given above and the detailed description of the preferred embodiments given below, serve to explain the principles of the invention.

FIGS. 1 and 2 show an electron beam excitation ion source according to an embodiment of the present invention, in which FIG. 1 is a partially cutaway perspective view of the ion source, and FIG. 2 is a cross-sectional view thereof;

FIG. 3 is a cross-sectional view of a housing as a modification of the embodiment shown in FIGS. 1 and 2; and FIGS. 4 and 5 show an electron beam excitation ion source according to another embodiment of the present invention, in which FIG. 4 is a partially cutaway perspective view of the ion source, and FIG. 5 is a view showing a relationship between an electrode and an electron extraction port.

DETAILED DESCRIPTION OF THE PREFERRED EMBODIMENTS

Figure 1:
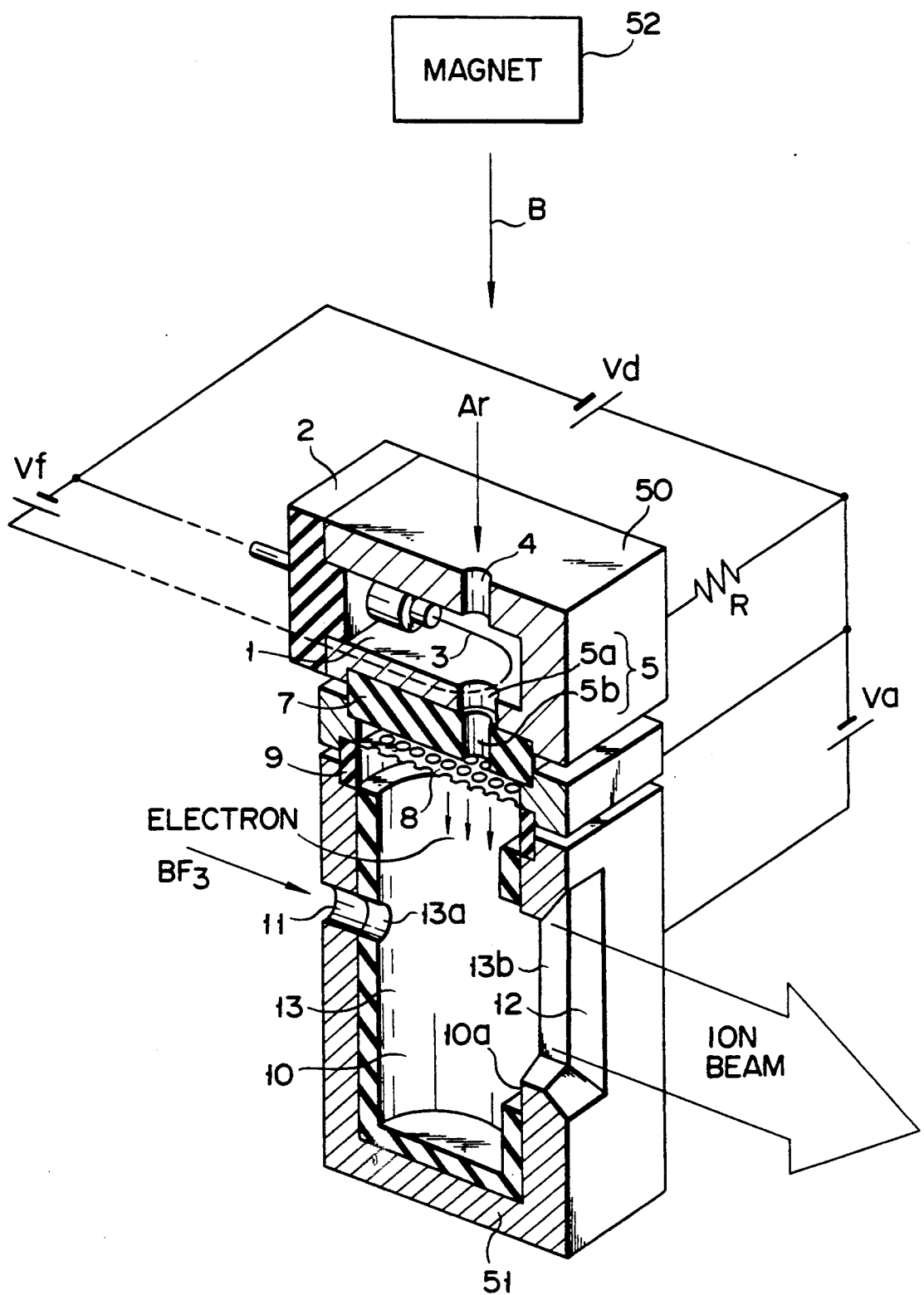

An electron beam excitation ion source according to an embodiment of the present invention will be described with reference to the accompanying drawings.

An electron generation chamber 1 is formed in a rectangular housing 50 made of a refractory conductive material such as molybdenum and having a side of, e.g., about a few centimeters. An opening is formed in one side surface of the housing 50. A plate-like insulating member 2 made of, e.g., $Si_3N_4$ or BN is formed to close this opening, so that the electron generation chamber 1 is hermetically arranged.

A U-shaped filament 3 made of tungsten or the like is mounted on the insulating member 2 so as to extend into the electron generation chamber 1. A discharge gas supply hole 4 is formed in the upper wall of the housing 50 to supply a discharge gas such as argon (Ar) gas to the electron generation chamber 1 so as to generate a plasma therein. A circular hole 5a having a diameter of, e.g., about 1 mm is formed in the lower wall of the housing 50 to extract electrons from the plasma generated in the electron generation chamber 1.

An insulating member 7 is arranged below the housing 50 to define a guide path 5b contiguous with the circular hole 5a. A porous electrode 8 having a large number of pores is connected to the housing 50 through the insulating member 7. The porous electrode 8 is made of a refractory material such as tungsten. The circular hole 5a and the path 5b constitute an electron extraction hole 5.

The discharge gas supply hole 4 and the electron extraction hole 5 are offset from the vertical central axis of the electron generation chamber 1 toward an ion extraction slit (to be described later). The ions, therefore, can be efficiently extracted.

The filament 3 is not located on a line obtained by connecting the discharge gas supply hole 4 and the electron extraction port 5. With this arrangement, ions which flow reversely from the electron extraction port 5 can hardly reach the filament 3. Sputtering of the filament 3 by the reverse ion flow can be prevented, and its wear can be prevented accordingly.

A housing 51 is connected to the lower portion of the porous electrode 8 through an insulating member 9. The housing 51 opposes the porous electrode 8 and has a closed upper end. An ion generation chamber 10 is defined in the housing 51. The housing 51 has a box-like shape and is made of a refractory material such as molybdenum. The ion generation chamber 10 has a cylindrical internal space and has a diameter of several centimeters and a height of several centimeters. A source gas supply port 11 is formed in one side wall of the housing 51 to supply a source gas (e.g., $BF_3$) for generating a desired type of ions to the ion generation chamber 10. An ion extraction opening or slit 12 is formed in the other side wall and opposes the source gas supply port 11. As shown in FIG. 2, an inner cylinder 13 having a bottom and made of an insulating material such as $Si_3N_4$ or BN is formed to define the internal shape of the ion generation chamber 10 The internal cylinder 13 has a circular opening 13a having the same shape as that of the source gas supply port 11 and an elongated rectangular opening 13b having the same shape as that of the ion extraction slit 12. The rectangular opening 13b is larger than the ion extraction slit 12 so that part or, preferably, the entire peripheral portion of a refractory inner wall 10a near the opening of the ion extraction slit 12 is exposed. With this structure, the exposed portion of the refractory inner wall 10a serves as an electrode during ion extraction to collect the electrons on the exposed electron surface, thereby causing an electric discharge during ion extraction.

In the electron beam excitation ion source having the arrangement described above, a magnetic field for vertically guiding electrons, as indicated by an arrow B, is generated by a magnetic generating means or magnet 52, and desired ions are generated.

A filament voltage Vf is applied to the filament 3 to heat it. At the same time, a discharge voltage Vd is applied across the filament 3 and the housing 50 through a resistor R, and an acceleration voltage Va is applied across the porous electrode 8 and the housing 51.

A discharge gas such as argon gas is then supplied from the discharge gas supply hole 4 to the electron generation chamber 1 to cause the discharge voltage Vd to generate a plasma upon discharging. Electrons in this plasma are extracted into the ion generation chamber 10 by the acceleration voltage Va through the electron extraction port 5 and the porous electrode 8.

At this time, a predetermined source gas such as $BF_3$ is already supplied to the ion generation chamber 10 through the source gas supply port 11. The interior of the ion generation chamber 10 is kept in a source gas atmosphere at a predetermined pressure of, e.g., 0.001 to 0.02 Torr.

The electrons flowing in the ion generation chamber 10 are accelerated by an acceleration electric field and collide against $BF_3$ ions to generate a dense plasma. Ions are then extracted from this plasma through the ion extraction slit 12. For example, the ions are supplied to, e.g., a mass-spectroscopic magnetic field (not shown) in an ion-implantation apparatus to cause the ion-implantation apparatus to perform ion implantation.

At this time, since most of the inner wall surface of the housing 51 is covered with the insulating inner cylinder 13 and only the inner wall portion 10a near the ion extraction slit 12 is exposed to the ion generation chamber 10, an electric discharge occurs only at this portion to cause ion extraction, and ion extraction can be effectively performed by a small amount of discharge current. Therefore, a higher ion current density can be obtained to shorten the processing time and increase the throughput, as compared with the conventional case.

The above embodiment exemplifies a structure in which the insulating inner cylinder 13 is arranged in the ion generation chamber 10. However, as shown in FIG. 3, a plate-like conductive member 21 made of a refractory material and having an ion extraction slit 12 may be arranged in the ion generation chamber 10 through an insulating member 20, and a voltage may be applied to only the plate-like member 21, thereby causing an electric discharge for ion extraction by only an exposed portion of the plate-like member 21 near the ion extraction slit 12.

As has been described above, in an electron beam excitation ion source according to the present invention, desired ions can be efficiently extracted by a small amount of discharge current, and a higher ion current density can be obtained, as compared with the conventional case. Therefore, the processing time can be shortened, and the throughput can be increased.

Another embodiment of the present invention will be described with reference to FIGS. 4 and 5.

Figure 5:
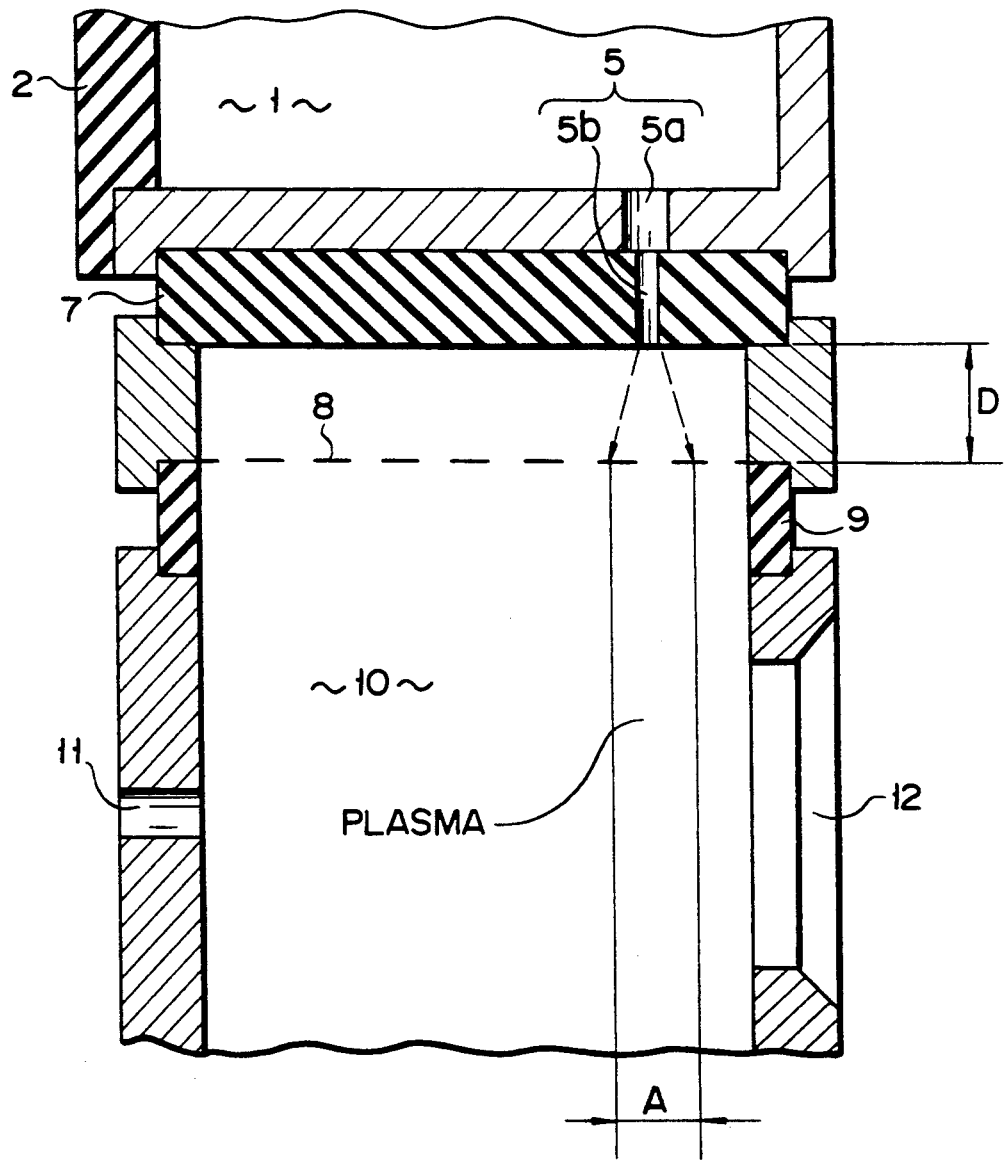

The same reference numerals as in the embodiment of FIGS. 1 and 2 denote the same parts in the embodiment of FIGS. 4 and 5.

An insulating cylinder 13 is not illustrated in FIGS. 4 and 5.

In the embodiment of FIGS. 4 and 5, a bottom plate 15 made of, e.g., a refractory material is fixed through an insulating member 14 on the bottom portion of an ion generation chamber 10 opposite to a porous electrode 8. The bottom plate 15 is electrically insulated (i.e., in a floating state) from the side wall portion of the ion generation chamber 10. The bottom plate 15 is irradiated with electrons and is charged to reflect the electrons. Note that the bottom plate 15 may comprise an insulating member to form an electron reflection surface.

As shown in FIG. 5, the porous electrode 8 is arranged near an electron extraction port 5 such that a distance between the porous electrode 8 and the electron extraction port 5 is 10 mm or less, e.g., 5 to 6 mm. With this structure, the source gas is irradiated with electrons without diffusion, as indicated by arrows in FIG. 5, and a diameter A of a generated plasma (secondary plasma) can be one to six times, e.g., twice that of the electron extraction port 5. The ions can be efficiently extracted from this high-density plasma through the ion extraction slit 12. As compared with the conventional case, a higher ion current density can be obtained. Therefore, the processing time can be shortened and the throughput can be increased in, e.g., ion implantation in the ion-implantation apparatus.

Additional advantages and modifications will readily occur to those skilled in the art. Therefore, the invention in its broader aspects is not limited to the specific details, and representative devices shown and described herein. Accordingly, various modifications may be made without departing from the spirit or scope of the general inventive concept as defined by the appended claims and their equivalents.

What is claimed is:

1. An electron beam excitation ion source comprising:
 a housing having an electron generation chamber, an ion generation chamber, and a partition wall for separating the ion and electron generation chambers, the electron generation chamber including a discharge gas supply port through which a discharge gas is supplied into the electron generation chamber, and the ion generation chamber including a source gas supply port through which a source gas is supplied into the ion generation chamber;

means for generating a discharge gas plasma using the discharge gas in the electron generation chamber;

means for extracting electrons from the discharge gas plasma, and accelerating and transporting the electrons into the ion generation chamber from the electron generation chamber through the partition wall, so that the accelerated electrons collide against the source gas to generate a source gas plasma including source gas ions in the ion generation chamber;

an ion extraction port formed in said housing though which the source gas ions are extracted from the ion generation chamber outside said housing; and means for generating in the ion generation chamber an eccentric electric field producing a local discharge around said ion extraction port so as to guide the source gas ions to said ion extraction port, the eccentric electric field having a higher intensity near the ion extraction port than other portions of the ion generation chamber to produce said local discharge around said ion extraction port.

2. An ion source according to claim 1, wherein said housing includes a slit constituting said ion extraction port.

3. An ion source according to claim 2, wherein said housing includes a side wall which defines said slit and has a conductive portion constituting said eccentric electric field generating means.

4. An ion source according to claim 2, wherein a side wall of said housing is made of a conductive material, and further comprising an electrically insulating cylinder, formed in said housing so as to be located along said side wall, for defining said ion generation chamber therein, said cylinder having an opening for exposing said slit and a side wall portion around said slit to said ion generation chamber.

5. An ion source according to claim 4, wherein said opening of said cylinder is larger than said slit and exposes said side wall portion around the entire periphery of said slit to said ion generation chamber.

6. An ion source according to claim 2, wherein said electric field generating means comprises a conductive plate arranged outside said housing near said ion extraction port, and an insulating plate, arranged between said conductive plate and said housing, for electrically insulating said conductive plate from said housing, said insulating plate having a first opening which communicates with said ion extraction port, and said conductive plate having a second opening which communicates with said ion extraction port through said first opening, the ions being extracted from said ion generation chamber to the outside of said housing via said first and second openings, and said first opening being larger than said second opening such that said first opening exposes a portion of an electrode plate around said second opening to said second opening.

7. An ion source according to claim 1, comprising said electron generation chamber having an electron extraction hole which communicates with said ion generation chamber, and a pourous electrode being spaced apart from said partition wall by a distance of not more than 10 mm.

8. An ion source according to claim 7, wherein said partition wall opposes said porous electrode with an interval of 5 to 6 mm.

9. An ion source according to claim 1 wherein said eccentric electric field generating means includes an electrode formed around said ion extraction port and an insulating means disposed in the ion generation chamber so that the electrode is exposed.

* * * * *